(12) United States Patent
Yamamoto

(10) Patent No.: US 7,289,167 B2
(45) Date of Patent: Oct. 30, 2007

(54) TELEVISION TUNER INCLUDING DISTRIBUTION CONNECTORS

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 482 days.

(21) Appl. No.: 10/932,972

(22) Filed: Sep. 2, 2004

(65) Prior Publication Data

US 2005/0073612 A1  Apr. 7, 2005

(30) Foreign Application Priority Data

Sep. 3, 2003  (JP)  ............................. 2003-270952

(51) Int. Cl.
  *H04N 5/44* (2006.01)
  *H03J 1/00* (2006.01)
  *H03J 3/00* (2006.01)
  *H03J 5/00* (2006.01)
  *H04B 1/10* (2006.01)
  *H04B 15/06* (2006.01)

(52) U.S. Cl. ..................... 348/731; 348/87; 348/607; 348/725; 348/731; 348/736; 348/737; 334/85; 455/300; 455/301; 455/310; 455/317

(58) Field of Classification Search ................ 348/87, 348/725, 607, 731, 736, 737; 334/85; 361/770; 455/300, 301, 310, 317, 333

See application file for complete search history.

(56) References Cited

U.S. PATENT DOCUMENTS

| | | | | |
|---|---|---|---|---|
| 5,050,238 A | * | 9/1991 | Tomizuka et al. | 455/300 |
| 5,111,274 A | * | 5/1992 | Tomizuka et al. | 257/659 |
| 5,369,552 A | * | 11/1994 | Barnes et al. | 361/816 |
| 5,710,999 A | * | 1/1998 | Iwase et al. | 455/349 |
| 6,131,023 A | * | 10/2000 | Matsuura | 455/301 |
| 6,160,571 A | * | 12/2000 | Wang | 725/127 |
| 7,030,939 B2 | * | 4/2006 | Yamamoto | 348/731 |
| 7,042,529 B2 | * | 5/2006 | Wakamori et al. | 348/836 |
| 2006/0050186 A1 | * | 3/2006 | Hosoi | 348/818 |

FOREIGN PATENT DOCUMENTS

| | | |
|---|---|---|
| JP | 3096172 | 6/1993 |
| JP | 10-032514 | 2/1998 |

* cited by examiner

*Primary Examiner*—Brian P. Yenke
(74) *Attorney, Agent, or Firm*—Brinks Hofer Gilson & Lione

(57) ABSTRACT

A metal frame body has first to fourth side plates and is divided, by a shield plate provided in the metal frame body, into a first compartment area near the first side plate and a second compartment area near the second side plate. A distributor is arranged in the first compartment area and a tuner unit is arranged in the second compartment area. A first connector is arranged in a position on the third side plate adjacent to the first compartment area and a second connector, which is connected to the distributor, is arranged in a position on the fourth side plate adjacent to the first compartment area. The distance from the second side plate to the central axis of the first connector is equal to the distance from the second side plate to the central axis of the second connector.

16 Claims, 2 Drawing Sheets

TELEVISION TUNER INCLUDING DISTRIBUTION CONNECTORS

This application claims priority to Japanese Patent Application No.: 2003-270952, filed on Sep. 3, 2003, which is incorporated herein by reference.

FIELD OF THE INVENTION

The present application relates to television tuners for distributing input television signals and for externally outputting the distributed television signals.

BACKGROUND

A known television tuner will be described with reference to FIG. 3. FIG. 3 is a plan view showing an arrangement of blocks constituting the television tuner. A rectangular metal frame body 21 has four side plates and includes four compartments 25 to 28 divided by shield plates 24. A distribution unit is accommodated in the compartment 25, a tuner unit is accommodated in the compartment 26, a demodulation unit is accommodated in the compartment 27, and a switching unit and a modulation unit are accommodated in the compartment 28. These circuit units are normally arranged on a printed circuit board.

An input connector 22 to which a television signal is input and an output connector 23 for outputting a television signal distributed by the distribution unit are mounted on a short side plate 29 of the metal frame body 21. Also, external terminal groups 31 to 33 protrude from a long side plate 30, which is one of plates adjacent to the short side plate 29. The external terminal groups 31 to 33 are provided for inputting and outputting power and signals supplied to the circuit units. The distribution unit, the switching unit, and the modulation unit are arranged in positions within the sections 25 and 28 along the short side plate 29, and adjacent to the input connector 22 and the output connector 23, respectively. The external terminal group 31 is mounted at the printed circuit board within the compartment 28 in which the switching unit and the modulation unit are arranged.

The distribution unit arranged in the compartment 25 splits the input television signal into two television signals. One of the distributed television signals is input to the tuner unit and the other of the distributed television signals is input to the switching unit. The tuner unit converts the input television signal into an intermediate-frequency signal and outputs the intermediate-frequency signal to the demodulation unit. A demodulated video signal or the like is output to a recorder/player or the like (not shown) via the external terminal group 33.

In contrast, the video signal or the like from the recorder/player or the like is input to the modulation unit via the external terminal group 31 and converted into an RF signal to be input to the switching unit. For playing back, the switching unit outputs the RF signal sent from the modulation unit to the output connector 23. A playback image can be viewed on a television set (not shown) by connecting an external television tuner to the output connector 23. If a playback image is not viewed, the switching unit outputs the distributed signal to the output connector 23. Accordingly, a received television signal can be viewed on the television set. (See, for example, Japanese Unexamined Patent Application Publication No. 10-32514 (FIG. 9).)

In the television tuner described above, the external terminal groups 31 to 33 are inserted into through-holes arranged in a mother board (not shown). Thus, the height from a face of the mother board to the input connector 22 is different from the height from the face of the mother board to the output connector 23. If the television tuner and an external television tuner having a similar shape are arranged in a row on the mother board, since the height of the output connector 23 of the television tuner is different from the height of an input connector of the external television tuner, a cable having connectors at both ends thereof for relaying connection must be used for the connection of the output connector 23 of the television tuner and the input connector of the external television tuner. Thus, an unwanted operation for connection is required, and this increases a parts cost.

SUMMARY

A television tuner that can be easily connected to an external television tuner when the television tuner and the external television tuner are arranged in a row is described.

The television tuner includes a distribution unit including at least a distributor for splitting an input television signal into two television signals; a tuner unit for frequency-converting one of the distributed television signals and for outputting an intermediate-frequency signal; and a metal frame body having a first side plate, a second side plate, a third side plate, and a fourth side plate, the metal frame body containing therein the distribution unit and the tuner unit. A shield plate divides the metal frame body into a first compartment area contiguous with the first side plate and a second compartment area contiguous with the second side plate, which faces the first side plate. The distributor is arranged in the first compartment area, and the tuner unit is arranged in the second compartment area. Terminals to be connected to a mother board are mounted on the second side plate. A first connector to which the input television signal is input is mounted in a position on the third side plate adjacent to, and communicating with, the first compartment area. A second connector for outputting one of the distributed television signals distributed by the distributor is mounted in a position on the fourth side plate adjacent to, and communicating with, the first compartment area. A distance from the second side plate to a central axis of the first connector is equal to a distance from the second side plate to a central axis of the second connector.

That is, the first connector to which a television signal is input is mounted on the third side plate, the second connector for outputting a distributed television signal is mounted on the fourth side plate that faces the third side plate, and the mounting height of the first connector is equal to the mounting height of the second connector. Thus, when the television tuner is mounted on a mother board in line with an external television tuner, the second connector may be directly connected to a connector of the external television tuner so that a television signal may be input from the second connector to the connector of the external television tuner. The two television tuners may be easily connected to each other without using additional components.

The distribution unit may include a first wide-band amplifier provided between the first connector and the distributor. The first wide-band amplifier may be arranged in a position within the first compartment area proximal the first connector. The distributor may be arranged in a position between the first wide-band amplifier and to the fourth side plate.

Thus, an increase in the noise figure of the distributor due to insertion loss can be avoided, and isolation between an input and an output of the first wide-band amplifier can be ensured.

The distribution unit may further include a second wide-band amplifier provided between the distributor and the tuner unit. The second wide-band amplifier may be arranged in a position between the distributor and the shield plate.

Thus, an input television signal can be input to the tuner unit over a short distance. Reverse isolation between the tuner unit and the distributor can be improved.

The distribution unit may include a third wide-band amplifier provided between the distributor and the second connector. The third wide-band amplifier may be arranged in a position between the distributor and the fourth side plate. Reverse isolation between the second connector and the distributor may be improved.

The second connector may be a pin plug, and thus the second connector can be easily mated with a pin jack connector of an external television tuner.

DETAILED DESCRIPTION

Examples may be better understood with reference to the drawings, but the examples are not intended to be of a limiting nature. Rather, the invention is to cover all modifications, equivalents, and alternatives falling within the spirit and scope of the invention which is set forth by the claims. Like numbered elements in the same or different drawings perform equivalent functions.

Figure 1:
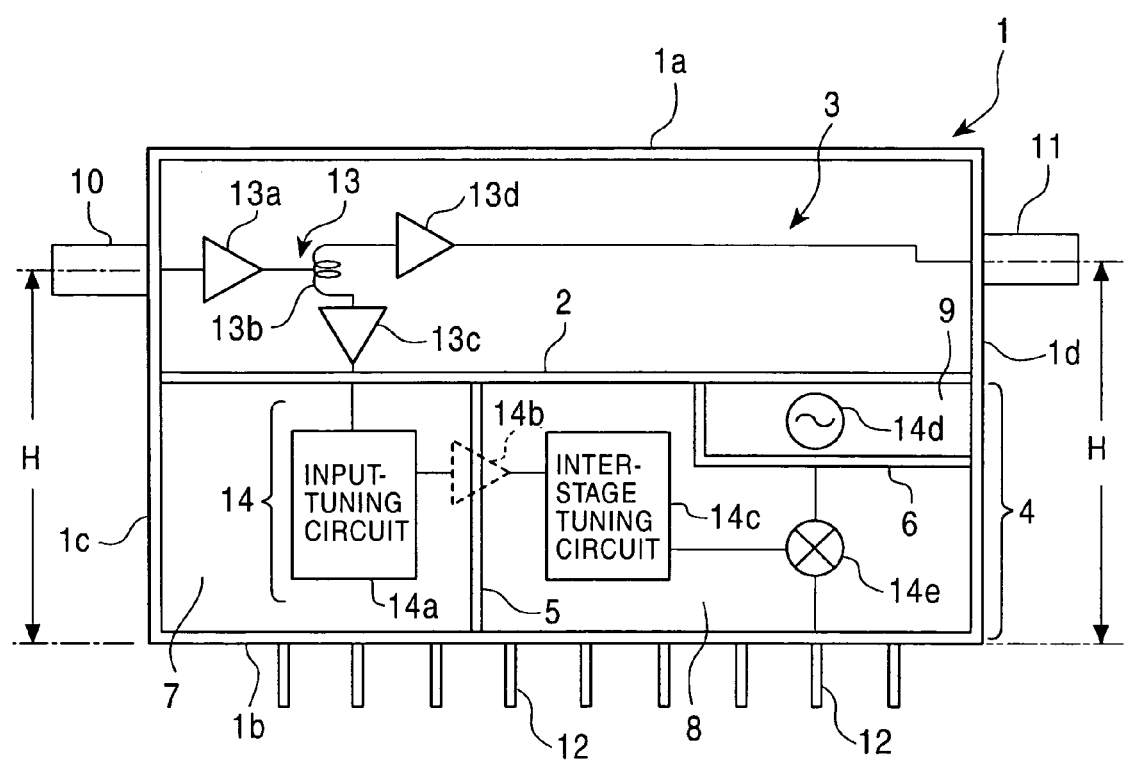
FIG. 1 is an elevation view showing an arrangement of blocks in a television tuner according to the present invention.

FIG. 1 is a plan view showing an arrangement of blocks constituting a television tuner. A rectangular metal frame body 1 has a first shield plate 2 inside thereof. The first shield plate 2 is parallel to a first side plate 1a and an opposing second side plate 1b, and the first shield plate 2 bridges a third side plate 1c and a fourth side plate 1d. The first shield plate 2 divides the metal frame body 1 into two compartment areas: a first compartment area 3 contiguous with the first side plate 1a; and a second compartment area 4 contoguous with the second side plate 1b.

A second shield plate 5 that bridges the first shield plate 2 and the second side plate 1b and an L-shaped third shield plate 6 that bridges the first shield plate 2 and the fourth side plate 1d further divide the second compartment area 4 into three sub-compartments: a first compartment 7 between the third side plate 1c and the second shield plate 5; a second sub-compartment 8 between the second shield plate 5 and the third shield plate 6; and a third sub-compartment 9 surrounded with the first shield plate 2, the third shield plate 6, and the fourth side plate 1d.

A circuit board (not shown) for configuring the first shield plate 2, the second shield plate 5, and the third shield plate 6 so as to stand orthogonal to the circuit board and for arranging various circuits in the first compartment area 3 and the second compartment area 4 (including the sub-first compartment 7, the second sub-compartment 8, and the third sub-compartment 9) is accommodated in the metal frame body 1.

A first connector (for example, an F-type coaxial connector) 10 to which a television signal is input is mounted in a position on the third side plate 1c adjacent to, and communicating with, the first compartment area 3. A second connector (for example, a coaxial pin plug) 11 for outputting a television signal is mounted on the fourth side plate 1d adjacent to and communicating with the first compartment area 3. The mounting height H of the first connector 10 (the distance from the second side plate 1b to the central axis of the first connector 10) is equal to the mounting height H of the second connector 11 (the distance from the second side plate 1b to the central axis of the second connector 11). Also, a plurality of terminals 12 is mounted in a row with approximately regular intervals on the second side plate 1b.

The first connector 10 is mounted such that it is at a distance H above the second plate 1b. The second connector 11 is mounted on the fourth side plate 1d, which faces the third side plate 1c on which the first connector 10 is mounted, and the mounting height H of the second connector 11 is equal to the mounting height H of the first connector 10. The mounting height H of the first connector 10, to which the television signal may be input, may be standardized as, for example, 30 mm, and when two television tuners are arranged in a row on the mother board, the television tuners may be easily connected to each other.

A distribution unit 13 for distributing the input television signal into two television signals is arranged in the first compartment area 3. The distribution unit 13 includes a first wide-band amplifier 13a for amplifying the input television signal; a distributor (for example, a distribution transformer) 13b for splitting the amplified television signal into two television signals; a second wide-band amplifier 13c for amplifying one of the distributed television signals; and a third wide-band amplifier 13d for amplifying the other of the distributed television signals. The first wide-band amplifier 13a, the second wide-band amplifier 13c, and the third wide-band amplifier 13d may not be provided. The first wide-band amplifier 13a disposed between the input connector 10 and the distributor 13b may be effective for reducing an increase in the noise figure (NF) due to distribution.

The first wide-band amplifier 13a is arranged in a position adjacent to the first connector 10. The distributor 13b is arranged in a position adjacent to the first wide-band amplifier 13a and proximal to the fourth side plate 1d.

The second wide-band amplifier 13c is arranged in a position adjacent to the distributor 13b and proximal to the first shield plate 2. The third wide-band amplifier 13d is arranged in a position adjacent to the distributor 13b and proximal the fourth side plate 1d. The second connector 11 is mounted in a position on the fourth side plate 1d proximal the third wide-band amplifier 13d.

A tuner unit 14 is arranged in the second compartment area 4. The tuner unit 14 includes an input-tuning circuit 14a; a high-frequency amplifier 14b (which may be mounted on a rear face of the circuit board); an interstage tuning circuit 14c; an oscillator 14d; a mixer circuit 14e; and the like. The input-tuning circuit 14a includes a tuning circuit section for an ultra high frequency (UHF) band and a tuning circuit section for a very high frequency (VHF) band. The input-tuning circuit 14a is arranged in a position within the first sub-compartment 7 adjacent to the second wide-band amplifier 13c. The high-frequency amplifier 14b includes a circuit section for the UHF band and a circuit section for the VHF band. The high-frequency amplifier 14b is arranged proximal to the second shield plate 5 and may be disposed on a rear face of the circuit board. The interstage tuning circuit 14c includes a tuning circuit section for the UHF band and a tuning circuit section for the VHF band. The interstage tuning circuit 14c is arranged in the second sub-compartment 8 near the second shield plate 5. The oscillator 14d is arranged in the third sub-compartment 9. The mixer circuit 14e is arranged in the second sub-compartment 8 near the fourth side plate 1d.

With the arrangement described above, the television signal input from the first connector 10 to the first wide-band amplifier 13a is amplified and then distributed as two television signals by the distributor 13b. One of the distributed television signals is input to the input-tuning circuit 14a in the first sub-compartment 7 via the second wide-band amplifier 13c. Then, the one of the distributed television signals is input to the mixer circuit 14e via the high-frequency amplifier 14b and the interstage tuning circuit 14c, and is finally converted into an intermediate-frequency signal in the mixer circuit 14e by being combined with an oscillation signal. The converted intermediate-frequency signal is output from the terminals 12. The other of the television signals from the distributor 13b may be output through the second connector 11 via the third wide-band amplifier 13d and input to an external television tuner.

Figure 2:
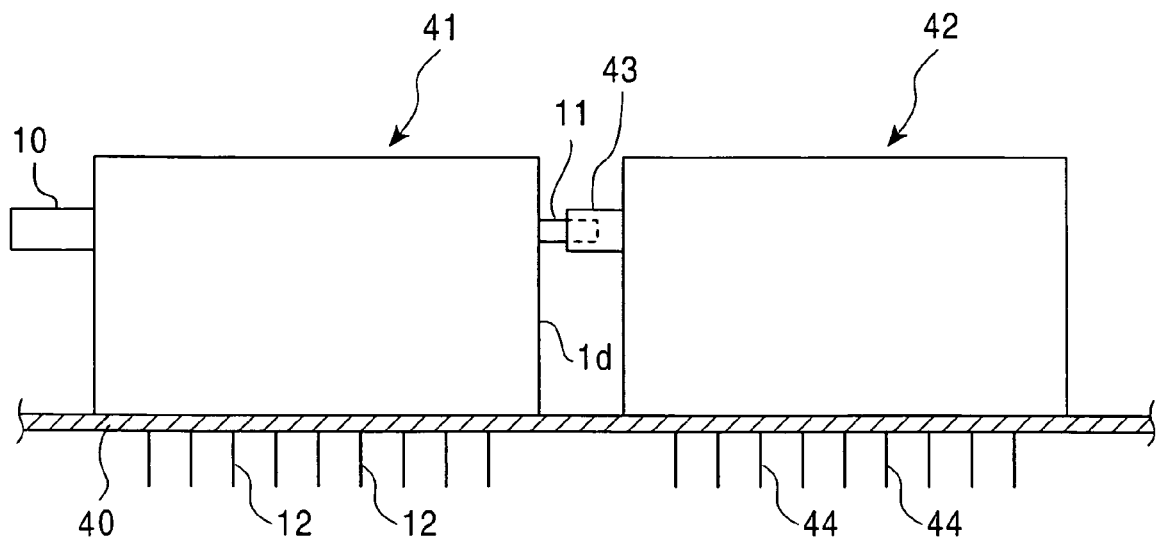
FIG. 2 is a side view showing an example of the connection to an external television tuner.
Figure 3:
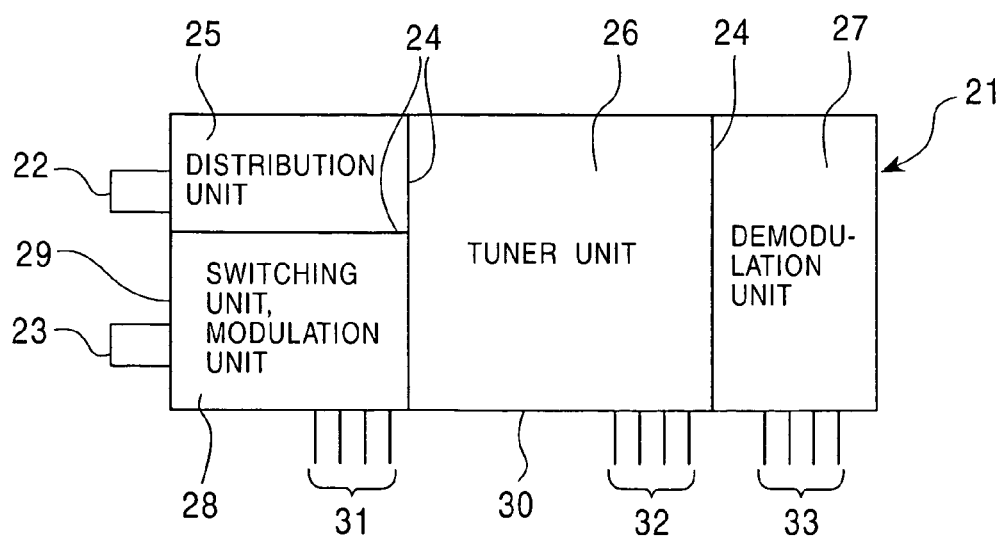
FIG. 3 is a plan view showing an arrangement of blocks in a known television tuner.

With the arrangement described above, the one of the distributed television signals from the distributor 13b is output to the second compartment area 4, which is isolated by the first shield plate 2, and the other of the distributed television signals distributed from the distributor 13b is output through the second connector 11 mounted on the fourth side plate 1d. Thus, the distributed television signals are output in a different direction from each other, and this may reduce mutual interference. Also, since the distributed television signals may pass through different wide-band amplifiers, isolation between the output terminals may be increased. FIG. 2 shows an example of use of a television tuner 41 according to the present invention. The television tuner 41 is mounted on a mother board 40. The terminals 12 are inserted into through-holes in the mother board 40. An external television tuner 42 includes a connector 43(for example, a pin jack) to which a television signal may be input. The mounting height of the connector 43 of the external television tuner 42 is equal to the mounting height of the second connector 11 of the television tuner 41. The external television tuner 42 is mounted on the mother board 40 such that the connector 43 faces the fourth side plate 1d of the television tuner 41, and terminals 44 are inserted in the mother board 40. The connector.43 of the external television tuner 42 is connected to the second connector 11 of the television tuner 41. The television tuner 41 and the external television tuner 42 may be mounted together on the mother board 40 with the second connector 11 and the connector 43 previously connected to each other.

Accordingly, two television tuners can be easily connected to each other without using special means, such as a cable or the like Other configurations of mating connector types may be used for the second connector 11 and the external tuner connector 43.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A television tuner device comprising:
   a metal frame including four side plates;
   a first shield plate which separates the space defined by the metal frame into a first compartment contiguous with a first side plate and a second compartment contiguous with a second side plate opposite to the first side plate;
   a first signal connector mounted on a third side plate and communicating with the first compartment;
   a second signal connector mounted on the fourth side plate and communicating with the first compartment;
   a distance from the second side plate to a central axis of the first signal connector is equal to a distance from the second side plate to a central axis of the second signal connector;
   a distribution unit disposed in the first compartment, the distribution unit splitting a signal from the first connector into at least a first and a second television signal; and
   a tuning unit disposed in the second compartment which converts the first television signal into an intermediate-frequency signal and outputs the intermediate-frequency signal,
   wherein the second signal connector outputs the second television signal.

2. The television tuner device according to claim 1, wherein:
   the distribution unit further includes a first amplifier provided between the first signal connector and the distributor;
   the first amplifier is arranged in a position within the first compartment area between the first signal connector and the distribution unit; and
   the distributor is arranged in a position between the first amplifier and the fourth side plate.

3. The television tuner device according to claim 2, wherein:
   the distribution unit further includes a second amplifier provided between the distributor and the tuner unit; and
   the second amplifier is arranged in a position between to the distributor and the first shield plate.

4. The television tuner device according to claim 2, wherein:
   the distribution unit further includes a third amplifier provided between the distributor and the second signal connector; and
   the third amplifier is arranged in a position between the distributor and the fourth side plate.

5. The television tuner device according to claim 1, wherein the second signal connector is a pin plug.

6. The television tuner device according to claim 1, further comprising terminals being mounted on the second side plate and outputting the intermediate frequency signal.

7. The television tuner according to claim 1, wherein the second side plate is mounted to a motherboard.

8. The television tuner device according to claim 1, wherein the tuning unit disposed in the second compartment includes a mixer circuit and an oscillator.

9. The television tuner device according to claim 8, wherein the tuner unit further comprises an input tuning circuit, a second shield plate separates the second compartment into at least a first sub-compartment and a second sub-compartment, the input tuning circuit being disposed in the first sub-compartment, the mixer and the oscillator being disposed in the second sub-compartment.

10. The television tuner device according to claim 1, wherein the tuning unit further comprises an interstage tuning unit, and an amplifier connecting an input signal tuning unit and the interstage tuning unit; a third shield plate which separates the second compartment into a first chamber and a second chamber, the interstage signal tuning unit and the mixer being disposed in the first chamber and the oscillator being disposed in the second chamber.

11. The television tuner device according to claim 10, wherein the amplifier bridges the second shield plate.

12. A method of cascading television tuners, comprising:
providing a shielded enclosure, having a metal frame including four side plates;
providing a first shield plate separating a space defined by the metal frame into a first compartment contiguous with a first side plate and a second compartment contiguous with a second side plate opposite to the first side plate;
providing a television signal input connector on a third side plate, said input connector communicating with the first compartment;
providing a distributor in the first chamber which splits an input signal into a first television signal and a second television signal;
providing a television signal output connector on a fourth side plate for outputting the second television signal, said output connector communicating with the first compartment; and
providing a tuning unit disposed in the second compartment which converts the first television signal into an intermediate-frequency signal and outputting the intermediate-frequency signal,
wherein a distance from the second side plate to a central axis of the input connector is equal to a distance from the second side plate to a central axis of the output connector.

13. The method according to claim 12, wherein the input connector and the output connector comprise mating connectors.

14. The method according to claim 12, wherein a second television tuner is directly connected to the second connector.

15. A television tuner assembly, comprising:
a first television tuner, having an input connector and an output connector on opposing faces of the tuner, disposed at a distance H from a mounting surface of the first television tuner; and
a second television tuner, having an input connector mounted to a face thereof, and disposed at a distance H from a mounting surface of the second television tuner, the input connector of the second television tuner and the output connector of the first television tuner comprising mating connectors,
wherein the mounting surface of the first television tuner and the mounting surface of the second television tuner are adapted to mount to a common surface, and the first television tuner and the second television tuner are arranged such that the output connector of the first television tuner and the input connector of the second television tuner are directly mated.

16. The television tuner assembly according to claim 15, wherein the first television tuner further comprises:
a metal frame including four side faces;
a first shield plate which separates the space defined by the metal frame into a first compartment contiguous with a first side face and a second compartment contiguous with a second side face opposite to the first side face;
a distribution unit disposed in the first compartment, the distribution unit splitting a signal from the first television tuner input connector into at least a first and a second television signal; and
a tuning unit disposed in the second compartment which converts the first television signal into an intermediate-frequency signal and outputs the intermediate-frequency signal,
wherein the first television receiver output connector outputs the second television signal.

* * * * *

UNITED STATES PATENT AND TRADEMARK OFFICE
CERTIFICATE OF CORRECTION

PATENT NO. : 7,289,167 B2
APPLICATION NO. : 10/932972
DATED : October 30, 2007
INVENTOR(S) : Masaki Yamamoto It is certified that error appears in the above-identified patent and that said Letters Patent is hereby corrected as shown below:

Column 6, in claim 3, line 5, after "a position between" delete "to".

Signed and Sealed this

Thirteenth Day of May, 2008

JON W. DUDAS
*Director of the United States Patent and Trademark Office*